United States Patent [19]
Paul et al.

[11] 4,377,786
[45] Mar. 22, 1983

[54] BATTERY TESTING APPARATUS

[75] Inventors: William A. Paul; James A. Paul, both of Toledo, Ohio

[73] Assignee: Radco Industries, Inc., Toledo, Ohio

[21] Appl. No.: 175,837

[22] Filed: Aug. 6, 1980

[51] Int. Cl.³ ............................................. G01N 27/42
[52] U.S. Cl. ..................................... 324/426; 324/437
[58] Field of Search ................................. 324/425–429, 324/437, 73 AT; 320/48; 429/90, 623.1

[56] References Cited

U.S. PATENT DOCUMENTS 3,609,525  9/1971  Clingenpeel ........................ 324/437
4,214,204  7/1980  Eberle ................................ 324/437

Primary Examiner—Michael J. Tokar
Attorney, Agent, or Firm—Allen D. Gutchess, Jr.

[57] ABSTRACT

Battery testing apparatus is provided for rapidly and automatically testing newly-manufactured electric batteries. The apparatus includes a testing machine which has at least one station, and preferably two, at which the batteries are tested for voltage and current output. By using two stations, the test at each station can be shorter and the change in the current output of a battery between the two stations helps to determine battery characteristics more effectively. Each of these stations has a stop for stopping a battery and a clamping arrangement for holding the battery at the station. Each station also has a pair of vertically movable terminal pads and a pair of horizontally movable terminal pads for top post batteries and side post batteries. The apparatus also includes an entry conveyor which is effective to supply one battery at a time to the stations of the machine and to effectively stop and hold a line of batteries to be tested. Adjustable, water-cooled shunts are also provided for the current output tests.

16 Claims, 5 Drawing Figures

BATTERY TESTING APPARATUS

This invention relates to battery testing apparatus for testing newly-manufactured batteries.

Testing newly-manufactured batteries has heretofore been essentially done by hand with an operator manipulating terminals to electrically engage the battery posts and check readings therefrom on suitable meters. This has been a relatively slow and time consuming operation, at best.

The present invention provides apparatus for automatically testing newly-manufactured batteries. The apparatus includes a testing machine which can employ two stations, with the voltage and current output of each battery checked at the stations. Particularly the change in current output at the second station as compared with that at the first station provides additional information of the electrical characteristics of the batteries. However, two stations are not essential.

The machine has a conveyor compressing a plurality of driven rollers which move the batteries therealong from an entry conveyor of the apparatus to and through the first and second test stations. Each of the stations has a stop for stopping the battery thereat and clamp means for holding a battery at the station. A pair of vertically movable terminal pads and a pair of horizontally movable terminal pads are movable toward and away from the batteries to engage top or side terminal posts and provide an electrical contact with the testing circuitry. The terminal pads are of a size such that they will engage the battery posts of various sizes of batteries, a variety of which may be supplied to the machine during any one period of time. The machine also has ejecting mechanism for pushing a defective battery off one side of the machine conveyor downstream of the test stations.

The entry conveyor is a belt type and the belt has a polyvinyl chloride coating which effectively engages the bottoms of the battery cases and holds them firmly in place when the conveyor is stopped. The apparatus is also equipped with limit switches and an additional stop near the entry end of the machine for further control of the batteries being supplied thereto. The arrangement enables the batteries to be fed one at a time to the testing stations even though there is a long line of batteries tending to pile up in front of the entry conveyor.

The new machine also is equipped with an adjustable, water-cooled shunt or pipe which carries the current from the batteries during the testing operations. The machine also has dual pressure, counterbalanced upper cylinders for the vertically movable terminal pads to prevent undue pressure on the upper battery posts due to the weight of the terminal pads and connected components.

It is therefor, a principal object of the invention to provide apparatus for automatically testing newly-manufactured batteries rapidly and having the features outlined above.

Other objects and advantages of the invention will be apparent from the following detailed description of a preferred embodiment thereof, reference being made to the accompanying drawings, in which.

Figure 1:
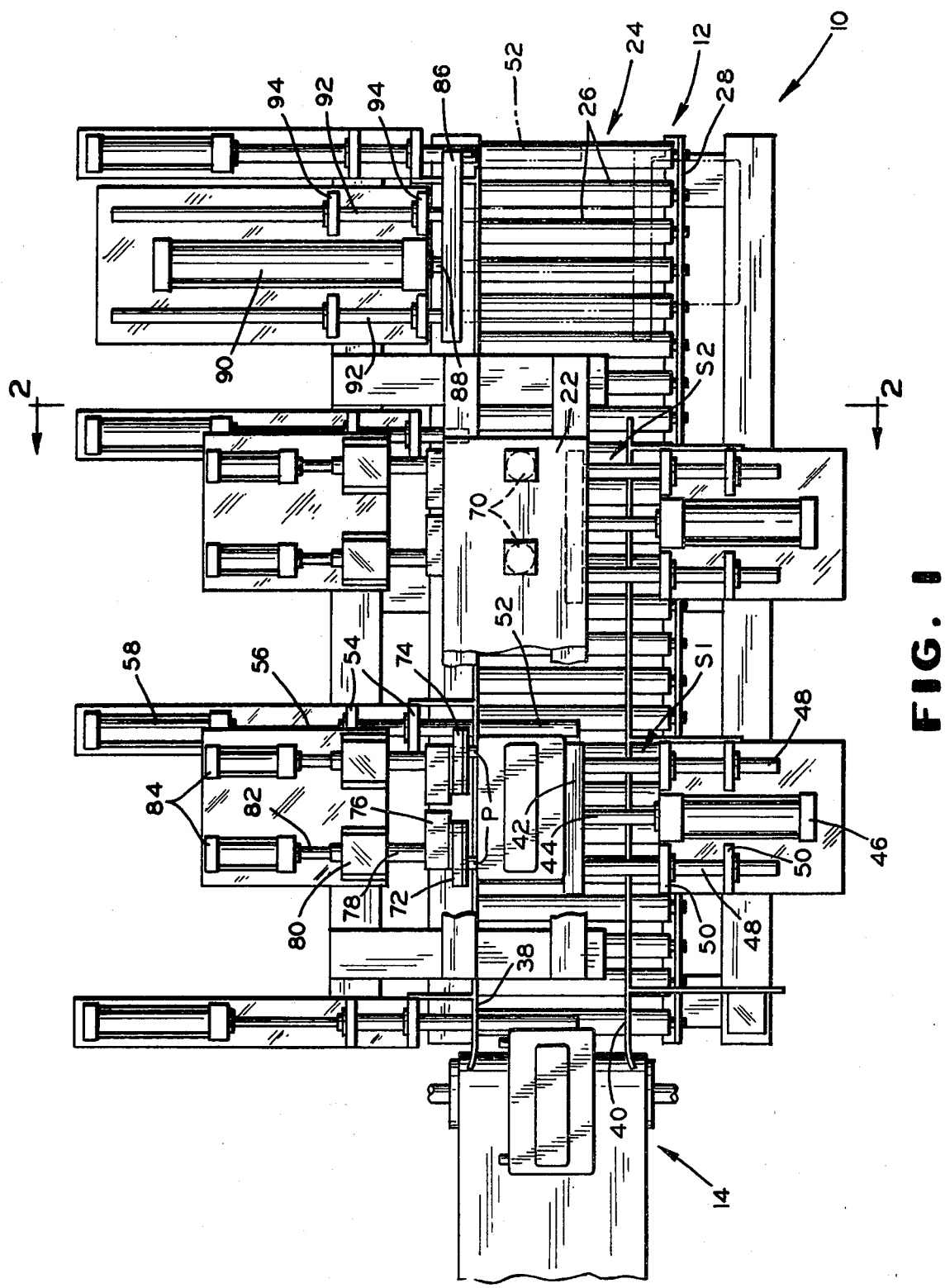
FIG. 1 is a plan view, with parts broken away, of battery testing apparatus according to the invention, including a battery testing machine and an entry conveyor.
Figure 2:
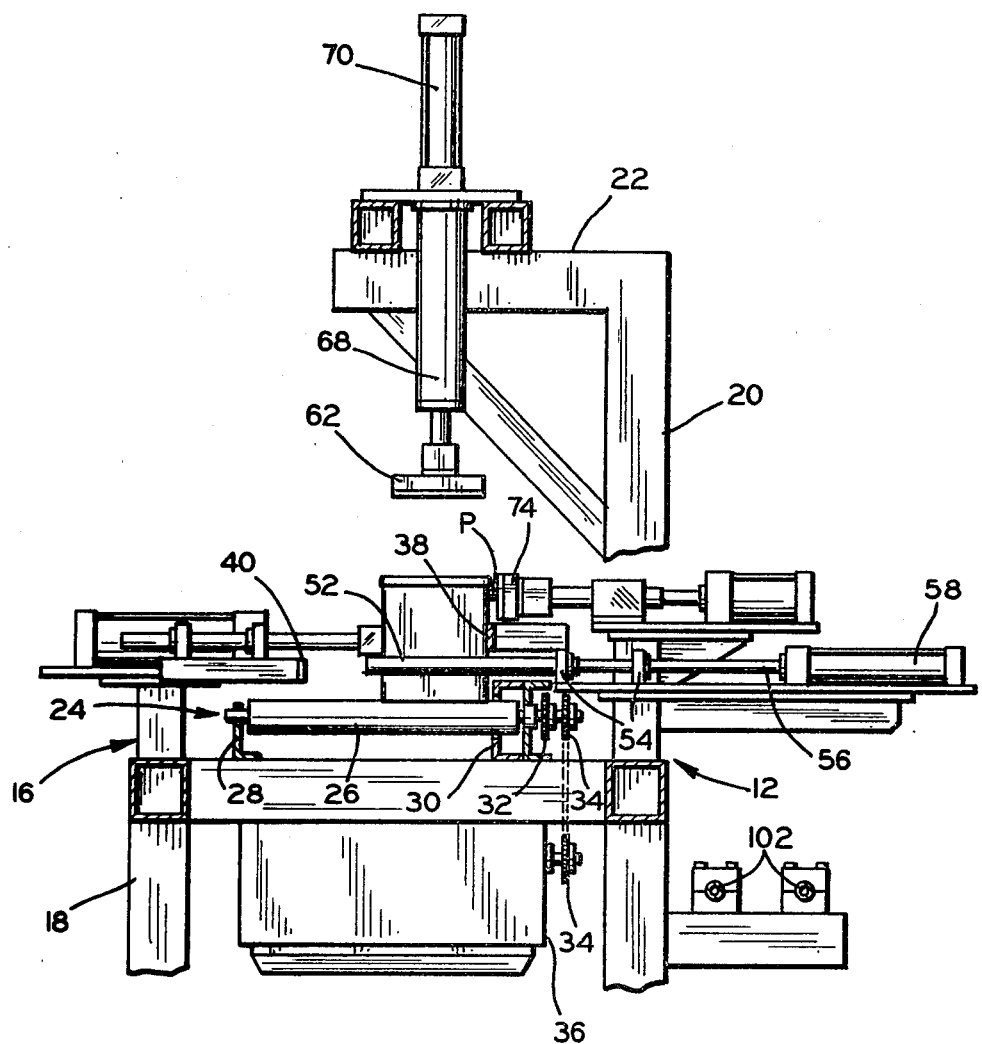
FIG. 2 is a fragmentary view in cross section, taken along the line 2—2 of FIG. 1.
Figure 4:
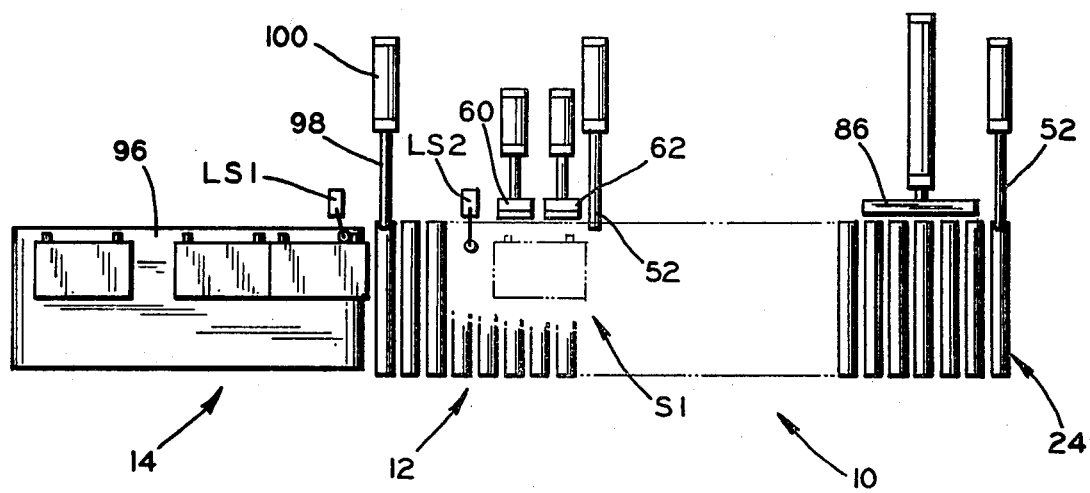
FIG. 4 is a schematic plan view of the battery testing apparatus, showing the manner in which the batteries are fed to the machine.
Figure 3:
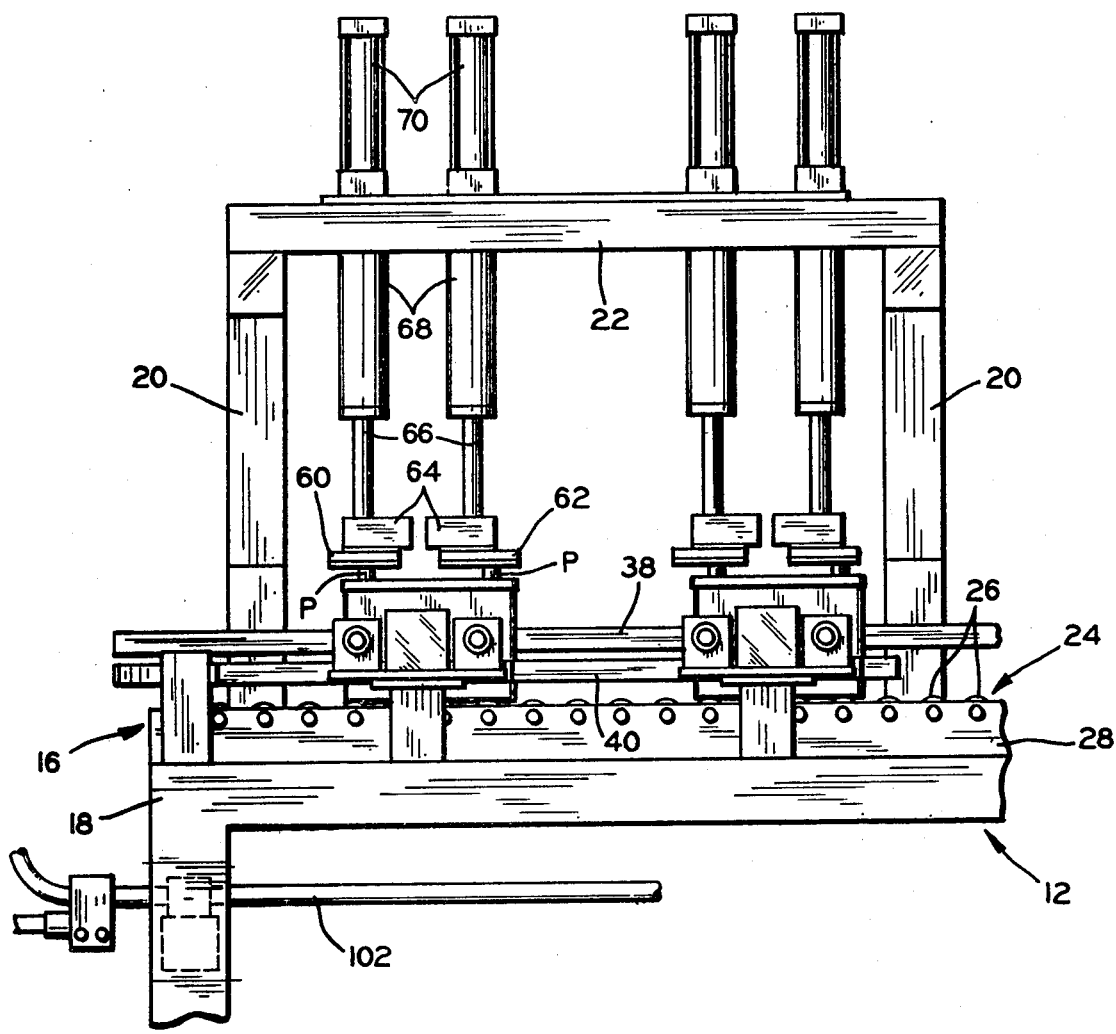
FIG. 3 is a fragmentary view in elevation of the battery testing machine.

Referring to FIGS. 1-3, battery testing apparatus in accordance with the invention is indicated at 10 and includes a battery testing machine 12 and an entry conveyor 14. The machine 12 includes a framework 16 having a base frame 18, uprights 20, and an upper frame 22.

A conveyor 24 carries batteries B from the entry conveyor 14 along the machine 12. The conveyor 24 includes a plurality of power rollers 26 rotatably supported by horizontal supporting rails 28 and 30. The rollers 26 are continuously rotated by individual driven sprockets 32 connected by chains to drive sockets 34 and a motor 36 (FIG. 2).

The machine conveyor 24 carries the batteries B from the entry conveyor 14 to a first testing station designated S1 and then to a second testing station designated S2. Only one station need be used but the two stations provide more rapid operation, with two sequential, shorter tests. The two stations also provide a better evaluation of certain characteristics of the batteries. At the first station, the voltage across the battery posts is measured and the current output also measured by connecting the batteries through a hollow, water-cooled shunt, to be discussed later. After that test, similar tests can be accomplished at the second station S2 to determine any change in voltage and current output, if desired. The components at the two stations are substantially identical and will not be described separately.

For guiding the batteries to the stations, a guide rail 38 is located at one side of the conveyor and a guide rail 40 is located at the other side. A clamping pad 42 is located adjacent the guide rail 40 and is movable toward and away from the guide rail 38 to clamp the battery B between that rail and the pad 42. Thus, the battery is held in position for testing, even though the rollers 26 continue to rotate. To move the clamping pad 42, it can be mounted on an end of a piston rod 44 extending from a fluid-operated cylinder 46 suitably mounted on a portion of the base frame 18. Guide rods 48 can also be connected to the clamping pad 42 and slidably carried in bearing blocks 50. Before the battery is clamped, it is stopped in position at the station S1 or S2 by a stop rod 52 slidably carried in blocks 54 and connected to a piston rod 56 extending from a fluid-operated cylinder 58.

When the battery B is positioned and held in place, two upper terminal pads 60 and 62 are moved downwardly to engage upper terminal posts P, when used, on the battery B. These pads are affixed to blocks 64 which are connected to piston rods 66 extending upwardly through linear bearing housings 68 and into fluid-operated cylinders 70 having counterbalance valving. The cylinders 70 provide a counterbalancing effect to prevent the weight of the terminal pads 60 and 62 and their connected components from possibly crushing the battery cases. The terminal pads 60 and 62 themselves are quite heavy, being of copper, with knurled faces to penetrate any oxide coatings on the battery posts P. The pads also are sufficiently large and positioned such that they will contact the upper battery posts P on a variety of sizes of batteries.

Each of the stations S1 and S2 also has two side terminal pads 72 and 74 (FIGS. 1 and 2) to contact side terminal posts P, when used on the battery B being tested. The pads 72 and 74 are affixed to blocks 76 which are connected to rods 78 slidably carried by bearing blocks 80. The rods 78 are connected to piston rods 82 extending from fluid-operated cylinders 84. Like the terminal pads 60 and 62, the pads 72 and 74, as shown, are sufficiently large and positioned such that they can engage side battery posts of a variety of sizes the batteries.

An injection area is located beyond the test stations S1 and S2 at which defective batteries can be removed from the conveyor 24. If the battery does not meet the criteria set in the test circuit, after a time delay, one of the stop rods 52 which is positioned at the end of the ejection area is extended over the conveyor and stops the defective battery. An ejection pad 86 is then moved over the conveyor 24 to push the defective battery off the side of the conveyor. The pad 86 is connected to a piston rod 88 of a fluid-operated cylinder 90 and has side guide rods 92 to maintain the orientation of the ejection pad 86. The guide rods 92 are slidably carried in bearing blocks 94. Guide rods are employed with the terminal pad cylinders and piston rods but are not all shown for clarity of illustration.

The batteries are fed one at a time to the testing machine 12 from the entry conveyor 14. This is not easy to accomplish since the batteries are frequently fed in end-to-end relationship along other conveyors to the entry conveyor 14. In that relationship, the batteries can build up a substantial force and can be hard to control. However, the entry conveyor 14 has a belt 96 which is coated with plastic, preferably polyvinyl chloride. It has been found that with this coating, and with the belt 96 sufficiently long to hold at least several batteries, when the conveyor 14 is stopped, those batteries on the conveyor provide an effective barrier to the unwanted entry or attempted entry of additional batteries onto the entry conveyor and toward the testing machine. Cooperating with the entry conveyor 14 is an entry stop rod 98 moved by a fluid-operated cylinder 100 along with limit switches LS1 and LS2.

With both conveyors 14 and 24 operating, and the stop rods 52 and 98 retracted, assume a single battery B is moving down the conveyor 14 toward the battery testing machine 12. When the battery contacts the second limit switch LS2, the stop rod 52 just downstream of the test station S1 is extended, stopping the battery at that test position. After a delay built into the circuitry, the test is started and at the same time the stop rod 98 is extended over the conveyors to stop any additional batteries. If during the testing, a second battery enters the entry conveyor 14, it will contact the limit switch LS1 and cause the conveyor belt 96 to stop, with the stop rod 98 in the extended position. When the test of the battery at the test station S1 is complete, the stop rod 52 is retracted to enable the battery to leave the station. The stop rod 98 will then retract and the conveyor 14 started to feed the next battery onto the conveyor 24.

When two or more batteries are entering the conveyor 14 in tight, end-to-end relationship, when the first battery contacts the limit switch LS2, the second battery is in contact with the limit switch LS1. These switches are spaced apart such that this will occur even though batteries of different sizes are involved. With both of those switches engaged, the conveyor belt 96 is stopped which stops the second battery and many more behind it, the second battery being on or at least mostly on the belt 96 of the entry conveyor 14. After a short delay to enable the first battery to move beyond the path of the stop rod 98, the stop rod 98 is extended to assure that no additional batteries will enter the testing machine. The first battery is then stopped and tested as before.

Figure 5:
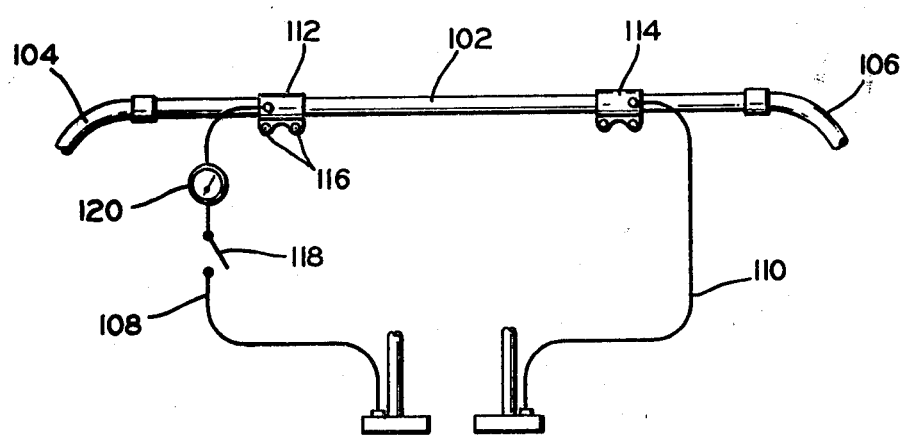
FIG. 5 is a diagrammatic view of a shunt circuit used with the machine.

During the current output test, the current from the battery is passed through a hollow, water-cooled shunt or pipe 102, shown schematically in FIG. 5. Water is supplied through the shunt by flexible hoses 104 and 106. Heavy, water-cooled conductors 108 and 110 are connected to the terminal pads and to two adjustable terminal clamps 112 and 114. These are clamped on the shunt 102 by fastening means such as bolts 116 which can be loosened to move the clamps therealong and thereby change the effective length of the shunt. The conductors can have a switch 118 and a meter 120 to control and measure the current output of the battery B under test.

It will be seen from the above that the battery testing apparatus in accordance with the invention provides smooth, rapid testing for newly-manufactured batteries. Further, the machine 12 can accommodate batteries of various sizes and shapes and, by the flip of a switch, accommodate batteries with reverse polarity. The machine also readily accommodates batteries with either side terminal posts or top terminal posts.

Various modifications of the above-described embodiment of the invention will be apparent to those skilled in the art, and it is to be understood that such modifications can be made without departing from the scope of the invention, if they are within the spirit and the tenor of the accompanying claims.

We claim:

1. Battery testing apparatus comprising frame means, a plurality of driven rollers mounted in horizontal, parallel relationship on said frame means, means for driving said rollers to move batteries along said frame means, first stop means for stopping batteries at a predetermined position along said frame means, means for holding the batteries at the predetermined position, a first pair of terminal pads, means for moving said first pair in vertical, parallel paths toward and away from the batteries, a second pair of terminal pads, second means for moving said second pair of terminal pads in horizontal, parallel paths toward and away from the batteries, means downstream of the predetermined position for ejecting batteries off said rollers and said frame means, an entry conveyor for moving batteries toward said frame means and onto said rollers, second stop means for stopping batteries substantially on said entry conveyor, and means engagable by the batteries for operating said first and said second stop means.

2. Battery testing apparatus according to claim 1 characterized by said engagable means including means engagable by batteries when on said entry conveyor and means engagable by batteries when on said rollers.

3. Battery testing apparatus according to claim 2 characterized by said means engagable by batteries when on said entry conveyor also being effective to stop said entry conveyor when engaged by batteries thereon.

4. Battery testing apparatus according to claim 3 characterized by said engagable means engagable by batteries on said rollers being effective to cause said first stop means to extend into the path of the batteries when engaged by batteries on said rollers.

5. Battery testing apparatus according to claim 4 characterized by said engagable means engagable by batteries on said rollers also being effective to extend said second stop means into the path of the batteries when engaged by batteries on said rollers.

6. Battery testing apparatus according to claim 1 characterized by an internally water-cooled conductor, means for supplying water through said conductor, and clamping means engagable with said conductor at selected positions therealong and connectable with at least one of said first pair and said second pair of terminal pads to receive current from batteries being tested.

7. Battery testing apparatus according to claim 1 characterized by said entry conveyor having a plastic coated conveyor belt.

8. Battery testing apparatus according to claim 1 characterized by said drive rollers being continuously driven by chain and sprocket drive means.

9. A battery testing machine comprising frame means, conveyor means supported on said frame means, stop means for stopping batteries at a test station along said frame means, means for holding batteries at the test station, two terminal pads, means for moving said terminal pads toward and away from terminal posts on the batteries at the test station, means downstream of the test station for ejecting defective batteries from said rollers and said frame means, a hollow shunt, means for supplying coolant through said shunt, a first terminal clamp mountable on said shunt to be clamped in any position therealong, a second terminal clamp mountable on said shunt to be clamped in any position therealong, a first conductor for connecting said first clamp to one of said terminal pads, a second conductor for connecting said second clamp to the other of said terminal pads, one of said conductors having switch means for connecting and disconnecting said terminal pads and said shunt.

10. A battery testing machine according to claim 9 characterized by said clamps having fastening means for selectively loosening and clamping said clamps relative to said shunt.

11. A battery testing machine according to claim 9 further characterized by an entry conveyor for supplying batteries to said conveyor means, said entry conveyor having a plastic coated conveyor belt.

12. A battery testing machine according to claim 11 characterized by said conveyor belt having a polyvinyl chloride coating.

13. A battery testing machine according to claim 9 characterized by said conveyor means comprising a plurality of rollers, and chain and sprocket means for continuously rotating said rollers.

14. Battery testing apparatus comprising frame means, a plurality of driven rollers mounted in horizontal, parallel relationship on said frame means, means for driving said rollers to move batteries along said frame means, first stop means for stopping batteries at a predetermined position along said frame means, means for holding the batteries at the predetermined position, a first pair of terminal pads, means for moving said first pair in vertical, parallel paths toward and away from the batteries, a second pair of terminal pads, second means for moving said second pair of terminal pads in horizontal, parallel paths toward and away from the batteries, means downstream of the predetermined position for ejecting batteries off said rollers and said frame means, an entry conveyor for moving batteries toward said frame means and onto said rollers, second stop means for stopping batteries substantially on said entry conveyor, and means engagable by the batteries for operating said first and said second stop means, said terminal pads having knurled faces to penetrate any coating on the battery posts.

15. Battery testing apparatus comprising frame means, a plurality of driven rollers mounted in horizontal, parallel relationship on said frame means, means for driving said rollers to move batteries along said frame means, first stop means for stopping batteries at a predetermined position along said frame means, means for holding the batteries at the predetermined position, a first pair of terminal pads, means for moving said first pair in vertical, parallel paths toward and away from the batteries, a second pair of terminal pads, second means for moving said second pair of terminal pads in horizontal, parallel paths toward and away from the batteries, means downstream of the predetermined position for ejecting batteries off said rollers and said frame means, an entry conveyor for moving batteries toward said frame means and onto said rollers, second stop means for stopping batteries substantially on said entry conveyor, and means engagable by the batteries for operating said first and said second stop means, said means for moving said first pads vertically comprising fluid-operated, counterbalanced cylinders having piston rods connected with said pads for partially offsetting the weight of said pads.

16. A battery testing machine comprising frame means, conveyor means supported on said frame means, stop means for stopping batteries at a test station along said frame means, means for holding batteries at the test station, two terminal pads, means for moving said terminal pads toward and away from terminal posts on the batteries at the test station, means downstream of the test station for ejecting defective batteries from said rollers and said frame means, a hollow shunt, means for supplying coolant through said shunt, a first terminal clamp mountable on said shunt to be clamped in any position therealong, a second terminal clamp mountable on said shunt to be clamped in any position therealong, a first conductor for connecting said first clamp to one of said terminal pads, a second conductor for connecting said second clamp to the other of said terminal pads, one of said conductors having switch means for connecting and disconnecting said terminal pads and said shunt, said terminal pads being vertically movable, and means for moving said pads vertically comprising fluid-operated, counterbalanced cylinders having piston rods connected with said pads for partially offsetting the weight of said pads.

* * * * *